United States Patent [19]

Camerlenghi et al.

[11] Patent Number: 5,576,990
[45] Date of Patent: Nov. 19, 1996

[54] VOLTAGE REGULATOR FOR NON-VOLATILE SEMICONDUCTOR MEMORY DEVICES

[75] Inventors: Emilio Camerlenghi, Bergamo; Giulio Casagrande, Agrate Brianza, both of Italy

[73] Assignee: SGS-Thomson Microelectronics, S.r.L., Agrate Brianza, Italy

[21] Appl. No.: 367,538

[22] Filed: Jan. 3, 1995

[30]     Foreign Application Priority Data

Dec. 31, 1993  [EP]  European Pat. Off. .............. 93830543

[51] Int. Cl.⁶ .......................... G11C 11/34; G11C 16/06
[52] U.S. Cl. .................. 365/185.23; 365/185.20; 365/185.18
[58] Field of Search ...................... 365/185.20, 185.21, 365/185.23, 185.18; 257/314, 315, 316, 318

[56]     References Cited

U.S. PATENT DOCUMENTS 4,858,186  8/1989  Jungroth ........................... 365/185.23
4,875,188  10/1989  Jungroth ........................... 365/185.23
5,253,201  10/1993  Atsumi et al. ..................... 365/185.23

FOREIGN PATENT DOCUMENTS 0145254  6/1985  European Pat. Off. .
0525679  2/1993  European Pat. Off. .
0538121  4/1993  European Pat. Off. .

Primary Examiner—Joseph A. Popek
Attorney, Agent, or Firm—Robert Groover; Betty Formby

[57]     ABSTRACT

A voltage regulator for electrically programmable non-volatile semiconductor memory devices of the type comprising a gain stage (3), supplied by a programming voltage ($V_{PP}$) and having an input terminal connected to a divider (6) of said programming voltage ($V_{PP}$) and an output terminal (U) connected to a programming line (5) of at least one memory cell (2) comprises at least one circuit element (4) capable of adapting the line programming voltage (5) to the length (L) of the memory cell (2). This solution makes it possible to have on the bit line of the memory device a drain voltage varying according to the actual length of the memory cell.

39 Claims, 6 Drawing Sheets

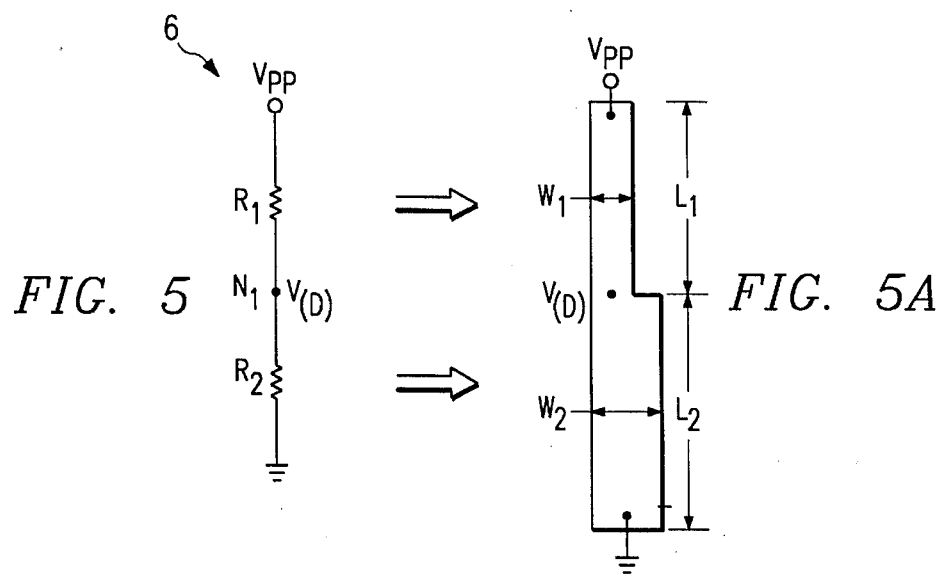
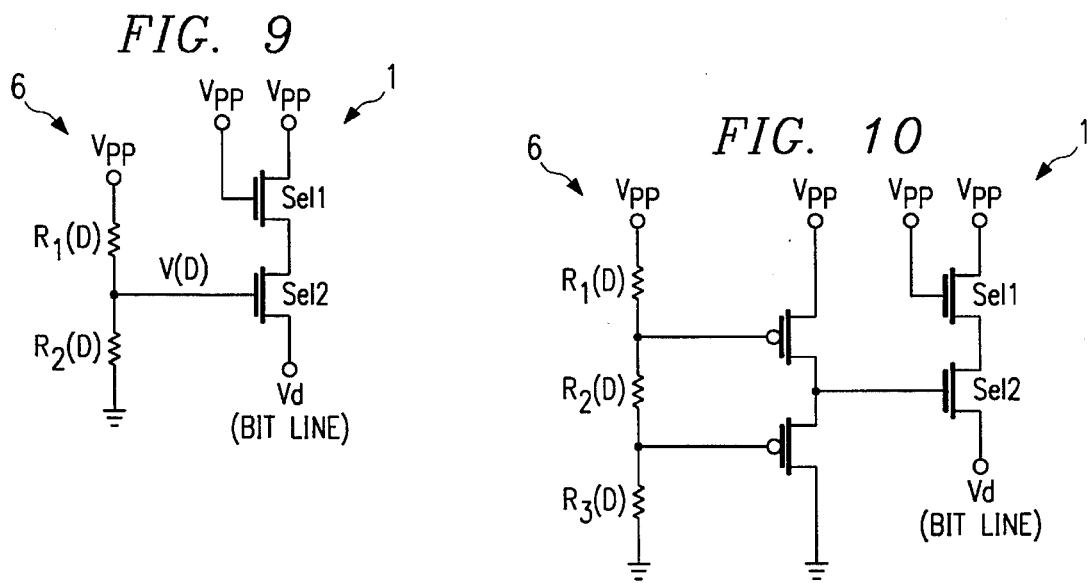

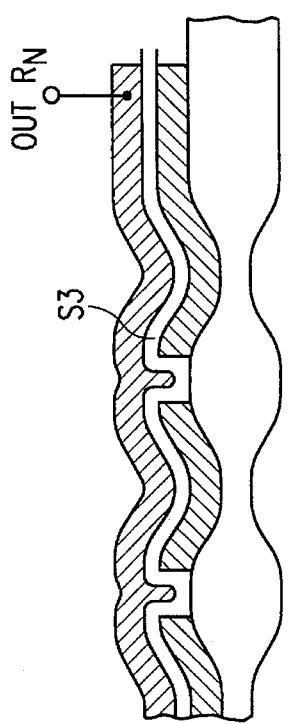
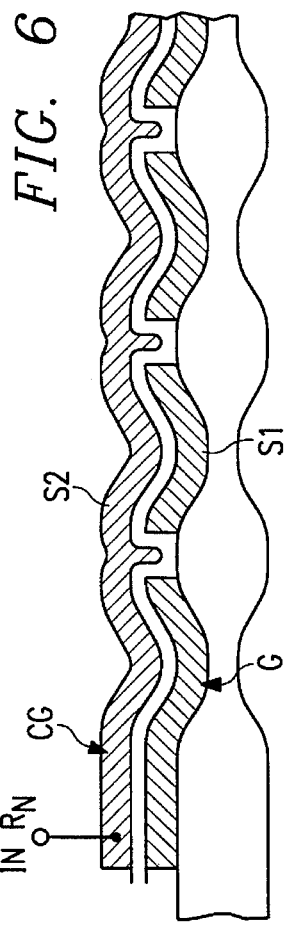
FIG. 6
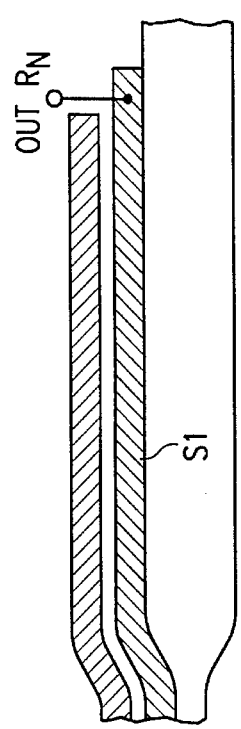
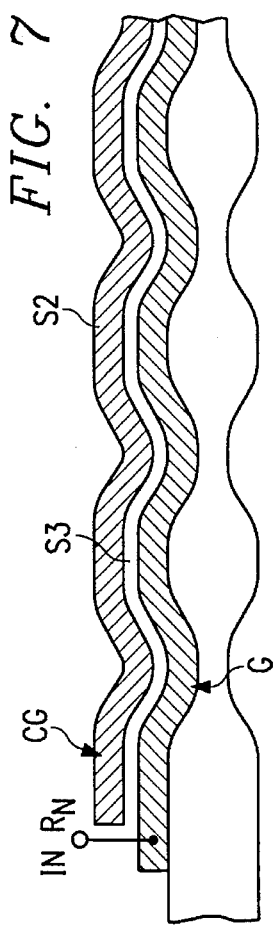
FIG. 7
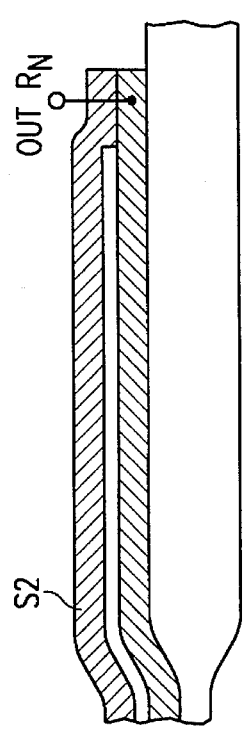
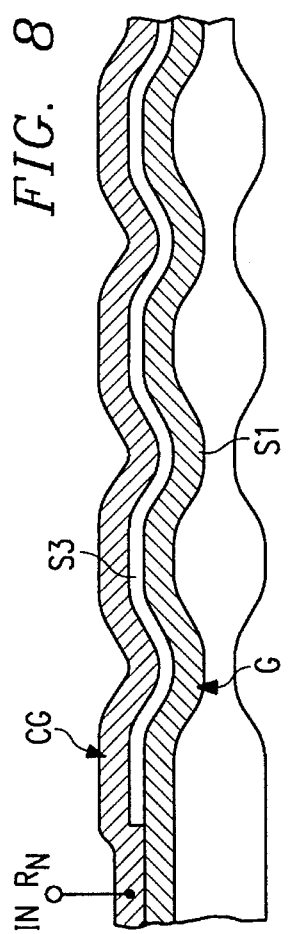
FIG. 8

VOLTAGE REGULATOR FOR NON-VOLATILE SEMICONDUCTOR MEMORY DEVICES

CROSS REFERENCE TO RELATED APPLICATION

This application claims priority from EPC App'n 93830543.0, filed Dec. 31, 1993, which is hereby incorporated by reference. However, the content of the present application is not necessarily identical to that of the priority application.

BACKGROUND AND SUMMARY OF THE INVENTION

The present invention relates to a voltage regulator for electrically programmable non-volatile semiconductor memory devices.

More specifically the present invention relates to a voltage regulator of the type comprising a gain stage supplied by a programming voltage and having an input terminal connected to a divider of the programming voltage and an output terminal connected to a programming line of at least one memory cell.

As known an individual non-volatile memory cell comprises an MOS transistor in which the gate electrode located over the channel region is floating, i.e. displays high continuous impedance to all the other terminals of the same cell and of the circuit in which the cell is inserted.

The cell also includes a second electrode, called a control gate, which is piloted through appropriate command voltages. The other electrodes of the transistor are the usual drain, source and body terminals.

By applying appropriate voltages to the cell terminals it is possible to change the charge quantity present in the floating gate, e.g. utilizing known Fowler-Nordheim Tunnelling and/or Channel Hot Electron Injection phenomena. This allows placing the transistor in two logic stages: a first state with "high" threshold voltage and a second state with "low" threshold voltage.

If a voltage is applied at the control gate which is intermediate between these two values, it is possible to "read" the state of the transistor since it displays between the drain and source terminals a low or high impedance depending on the threshold voltage value. Therefore the transistor can be considered a logic memory element.

Since the floating gate presents a high impedance toward any other cell terminal, the charge stored therein can persist for an indeterminate time even if supply is removed from the circuit in which it is inserted. The cell therefore displays non-volatile memory characteristics.

The operation by which the charge is stored in the floating gate is termed "programming" while the operation by which the charge is removed from the floating gate is termed "erasure".

Generally a non-volatile memory circuit integrated on a semiconductor comprises a multiplicity of cells of the above type organized in rows (parallel to "word line" conductors) and columns (parallel to "bit line" conductors). The cells belonging to a given row share a word line which is connected to pilot all of their respective control gates, while the cells belonging to a given column have their drain terminals all connected together.

It is also known that non-volatile memory cells and in particular the FLASH type require accurate control of drain voltage Vd during the programming phase, i.e. the voltage applied on the bit line. The drain voltage must indeed satisfy several conditions listed below:

It must be high enough to allow fast cell programming, it must be at the same time low enough to avoid the so-called "soft-erasing" phenomenon, which consists of partial erasure of the cell or degradation of the characteristics of the cell with use, and for reliability reasons it must always be such as to avoid setting off the phenomenon known as "parasitic-bipolar" operation.

The optimal range for such a voltage is in general rather small and typically between 5 and 6 volts.

It is noted also that the conditions indicated above are variable depending on the production process and in particular depending on the length of the memory cell. The production processes indeed lead to variations in the dimensions of the cells and in particular of the polysilicon layers and this represents one of the critical parameters in production.

Taken all together the above observations lead to the conclusion that it is necessary to equip the memory circuit with a particularly refined and accurate voltage regulator to supply the correct voltage to the bit line in the programming phase.

The known art already proposes some solutions to meet this requirement.

In general since the voltages supplied from the outside to the memory circuit are substantially two and in particular a 5 V supply voltage Vcc and a 12 V programming voltage $V_{PP}$, control of drain voltage is normally achieved by division of the programming voltage $V_{PP}$.

In this manner there is achieved a drain voltage relatively stable as concerns temperature and the circuit production process parameters and variable by ±5% with the programming voltage $V_{PP}$.

In the annexed FIG. 1 is shown schematically a first circuit solution of known type provided by utilizing division of the programming voltage.

The voltage regulator shown in FIG. 1 comprises a resistive divider consisting of three resistances R1, R2, R3 connected between the programming voltage line $V_{pp}$ and ground. In parallel with the resistances is a group of four MOS transistors connected in series with each other through their respective source and drain terminals.

The gate terminals of the first transistor M1 and fourth transistor M4 are connected between the first and second resistances and between the second and third resistances.

The voltage applied to the bit line is taken on the gate terminal of the second transistor M2 which is inserted in the circuit in diode configuration with gate and drain short-circuited.

This voltage is actually applied to the bit line unless there is a negative translation of level due to the presence of a first selection transistor M6 and a second selection transistor M7 for writing.

Although advantageous from certain viewpoints, this solution is not entirely effective and displays some shortcomings.

As already mentioned, the programming current absorbed by the memory cell can vary from one integrated circuit to another because of the inevitable variations inherent in the production process. It can undergo variations also because of the surrounding conditions in which the circuit is made to operate.

If the current passing through the bit line and hence the output stage of the regulator is actually different from the one called for by the design it follows that the voltage on the bit line will also be wrong or different from that desired.

In addition, since during programming the threshold voltage of the cell tends to rise progressively it follows that the current absorbed by the cell decreases in time. Since with the circuit described above voltage regulation is based on an average programming current, it will not give good results steadily.

A second solution of the known art is shown in FIG. 2 and provides that the drain voltage be supplied by a so-called source-follower piloted by an operational amplifier with appropriate feedback connections.

Even this solution is not free of shortcomings. In particular, this circuit proved to be slow in the reading phase because it seems to increase the capacitance of the bit line.

In addition, it has been observed that with the decrease in the cell dimensions and in particular their actual length, ever closer limits are imposed on drain voltage variation range and this compromises the reliability and performance of the entire memory circuit.

The technical problem underlying the present invention is to conceive a voltage regulator which would supply the bit line constantly at the output with a voltage such as to pursue optimally production process variations.

In other terms, the purpose of the present invention is to conceive a voltage regulator capable of adapting to the actual length of the memory cell and overcoming the limits of the present solutions.

In this manner there is achieved a drain voltage relatively stable as concerns temperature and the circuit production process parameters and variable by ±5% with the programming voltage $V_{PP}$.

The solution idea underlying the present invention is to insert in the regulator a voltage divider varying with the actual length L of the memory cell by utilizing the resistivity of the material making up the cell gates.

On the basis of this solution idea the technical problem is solved by a voltage regulator which uses a voltage divider to scale down the programming voltage $V_{PP}$, IN A WAY WHICH IS DEPENDENT ON DEVICE PARAMETERS, to provide a line programming voltage which varies to compensate for variation in the length (L) of the memory cell. This makes it possible to provide a drain voltage which varies according to the actual length of the memory cell.

A simple voltage divider network using identical elements would not result in any variation of the intermediate voltage with the channel length, and thus would apparently not be suitable for implementing the invention. However, by using different W/L proportions in the individual resistor elements, the ratio of the divider network will change with linewidth variation.

The characteristics and advantages of the voltage regulation circuit in accordance with the present invention are set forth in the description of an embodiment thereof given below by way of non-limiting example with reference to the annexed drawings.

BRIEF DESCRIPTION OF THE DRAWING

The disclosed inventions will be described with reference to the accompanying drawings, which show important sample embodiments of the invention and which are incorporated in the specification hereof by reference, wherein:

FIG. 5 shows a diagram of a detail of the embodiment of FIG. 4. FIG. 5A shows diagrammatically an embodiment of the detail of FIG. 5.

FIGS. 6 to 8 show schematic vertical cross section and enlarged scale views of a portion of an integrated semiconductor memory circuit in which is provided a detail of the regulator of FIG. 3, and FIGS. 9 to 11 show diagrams of additional embodiments of the regulator in accordance with the present invention.

DETAILED DESCRIPTION OF THE PREFERRED EMBODIMENTS

Figure 1:
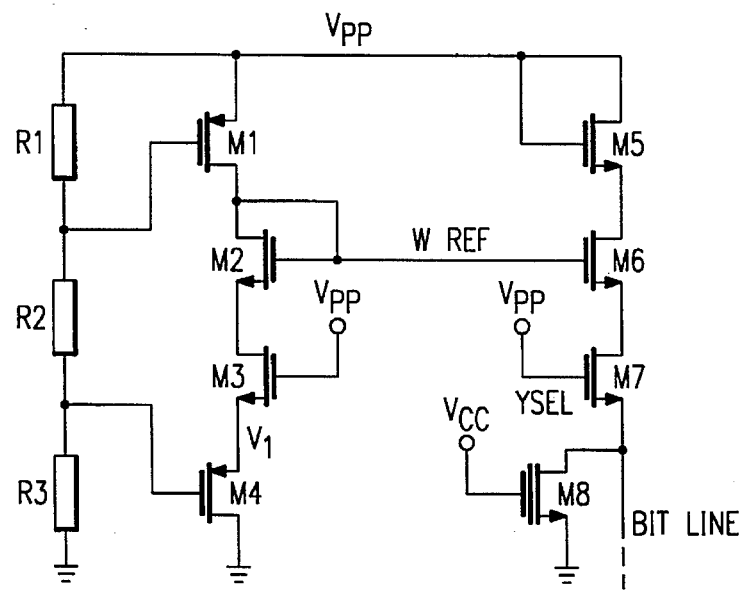
FIG. 1 shows a diagram of a programming circuit incorporating a voltage regulator provided in accordance with the known art.
Figure 2:
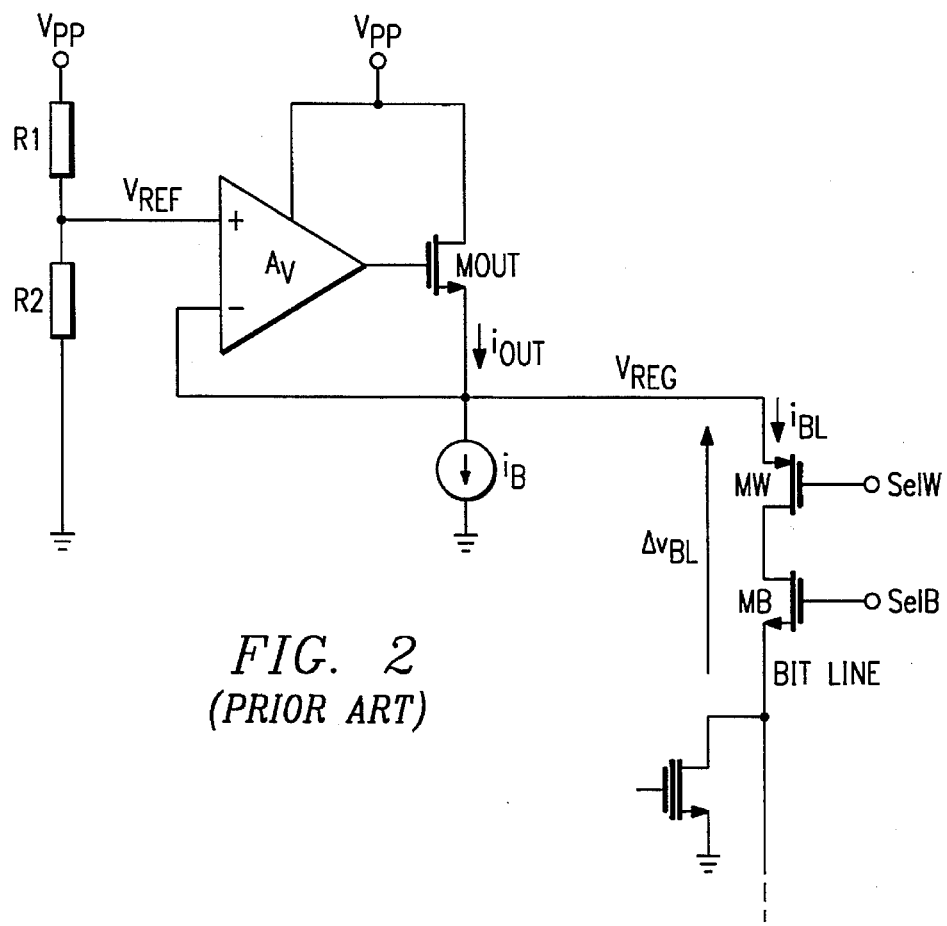
FIG. 2 shows another diagram of a programming circuit incorporating another voltage regulator of known type.
Figure 3:
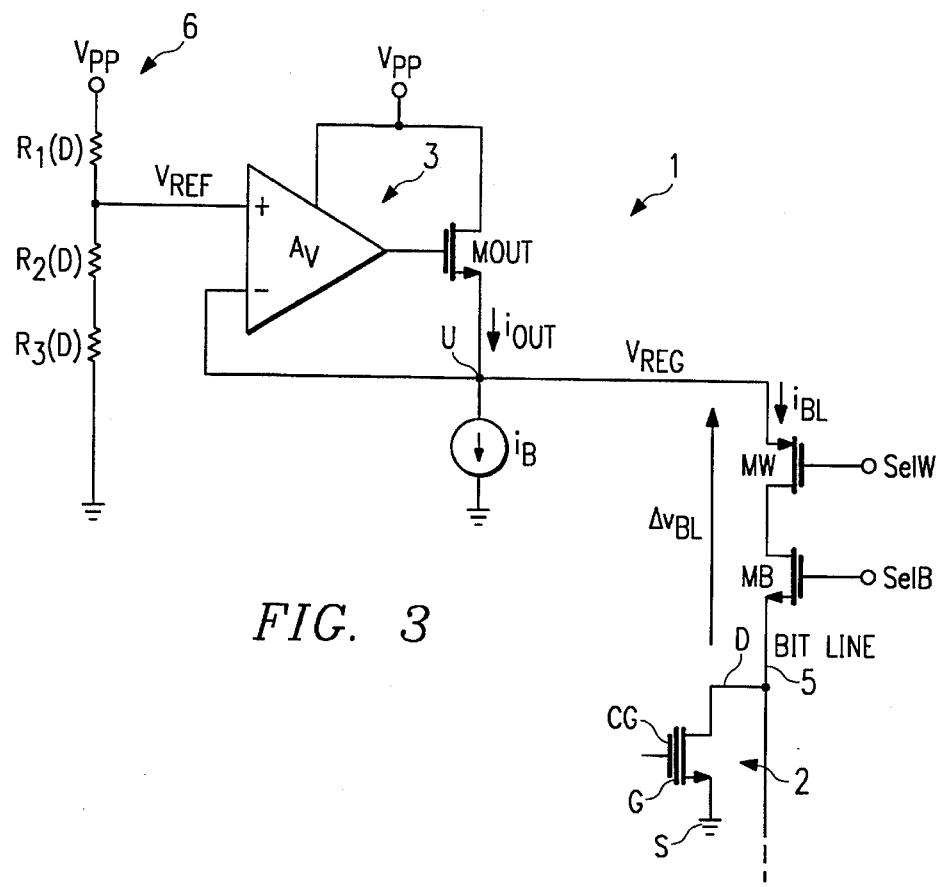
FIG. 3 shows diagrammatically a first embodiment of a regulator in accordance with the present invention.

The numerous innovative teachings of the present application will be described with particular reference to the presently preferred embodiment (by way of example, and not of limitation), in which:

With reference to FIG. 3, 1 designates as a whole and schematically a programming circuit for at least one electrically programmable non-volatile memory cell 2, e.g. a FLASH cell.

The cell 2 together with other cells of the same type is provided with an MOS transistor with floating gate G equipped with another gate CG termed control gate.

The cells 2 are organized in columns with the respective source terminals S all connected to the same reference voltage, e.g. a signal ground GND, and with the respective drain terminals D connected together on a so-called bit line 5.

The bit line 5 also comprises a pair of MOS transistors MB and MW connected in series together for selection of the bit line.

The circuit 1 comprises a voltage regulator 3 designed in accordance with the present invention to regulate drain voltage of the cell 2 during programming thereof and designated below by Vd.

For this purpose the regulator 3 comprises a gain stage provided by an operational amplifier Av, e.g. with unit gain, in cascade with which is connected a source-follower stage. The follower stage comprises an MOS transistor Mout biased by a constant current generator Ib.

The amplifier Av has a non-inverting input on which is applied a voltage Vref to be repeated on an output of the regulator 3 to supply the load consisting of the bit line 5. The output U is connected in feedback on another inverting input of the amplifier Av.

The voltage Vref is achieved by division of a programming voltage VPP performed by a resistive divider 6 comprising a pair of resistors R1 and R2.

The resistances R1 and R2 are inserted between a voltage terminal $V_{PP}$ and the signal ground.

Advantageously in accordance with the present invention the regulator comprises at least one circuit element allowing adaptation of the output voltage to the electrical length L of the memory cell.

In the embodiment described here by way of non-limiting example, this element is the divider 6 with resistors R1, R2 and R3 having resistivity varying with the length L of the memory cells 2.

In accordance with the present invention the divider 6 is advantageously provided by using portions of the same material of which are made the gate terminals of the memory cell and thus utilizing the internal resistivity of this material.

These gate terminals consist typically of n+ doped polysilicon, or silicide, but the idea can be extended to any other technology for embodiment of gates, e.g. utilisation of p+ doped polysilicon.

Figure 4:
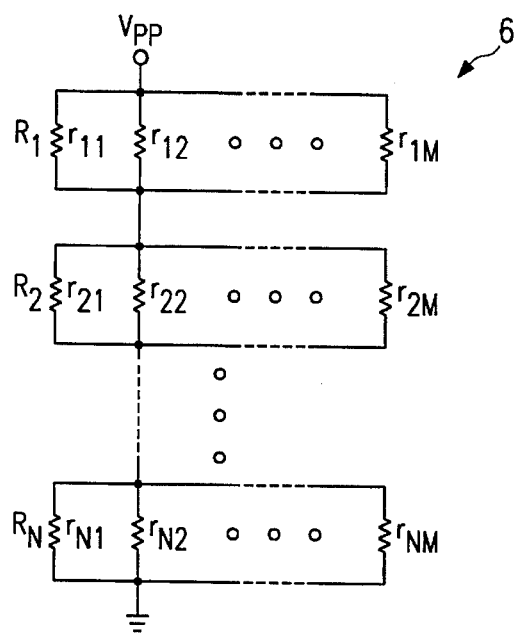
FIG. 4 shows diagrammatically a detail of the regulator in accordance with FIG. 3.

The more general form of the variable divider 6 is given in FIG. 4 in which this divider 6 comprises N resistances R1, R2, ..., RN, each of which is in turn obtained as the parallel of M resistances rN1, rN2, ..., rNM, where the value of M is chosen on the basis of the value of N.

Every resistance rNM is provided by means of a section of n+ doped polysilicon having length LNM and width WNM.

The value of the resistances rNM varies with the width WN of the material portion. The width WN can be greater or less than the design dimensions in accordance with an appropriately set quantity which can be designated by D.

This quantity D is linked to process differences such as lithographic over- or under-exposure, variation of the slope of the etch profile, etc.

Consequently, even the value of resistance Rn depends on the difference D between the dimension obtained in the embodiment and the design dimension.

To illuminate this dependence let us use the notation rNM(D) and RNM(D).

The simplest embodiment of this variable divider 6 is obtained with a series of only two resistances RNM where N=2 and each of which is provided by a single resistance rNM where M=1.

This embodiment is shown diagrammatically in FIG. 5 by way of non-limiting example as concerns the invention. Therein a variable reference voltage V(D) is taken in the node N1 intermediate between a first resistance R1(D) and a second resistance R2(D) varying with the actual length L of the cell.

These resistances RNM can be achieved in practice in various ways.

The non-volatile memory cell 2 is the so-called double polysilicon level type. Basically, the heart of the cell comprises an MOS transistor with the floating gate G provided by means of a polycrystalline silicon layer S1.

Over the floating gate G is provided the control gate electrode CG provided by means of a superimposed polysilicon and silicide layer S2.

The control gate CG is coupled capacitively with the floating gate G by means of an intermediate dielectric layer S3.

The control gate electrode CG is in common with all the cells making up the same line or word line.

To provide the variable resistances it is thus possible to use the conductor layers which constitute the gates of the word line cells of the memory matrix. Advantageously there are used appropriately word lines purposely introduced and termed hereinafter dummy word lines. These are lines of overabundant cells purposely inserted in the memory structure and analogous for example to the so-called redundant lines provided for safety reasons.

FIG. 5A shows details of a sample implementation of FIG. 5. The dummy word lines used must have appropriate relative widths and lengths W1, W2, L1 and L2. The widths and lengths W1, L1, W2 and L2 are selected as a result of the following system of equations:

$$Vd(W+\Delta) = Vpp \cdot \frac{\frac{L2}{(W2+\Delta)}}{\frac{L1}{(W1+\Delta)} + \frac{L2}{(W2+\Delta)}}$$

$$Vd(W-\Delta) = Vpp \cdot \frac{\frac{L2}{(W2-\Delta)}}{\frac{L1}{(W1-\Delta)} + \frac{L2}{(W2-\Delta)}}$$

where:

$\Delta$ is the dimensional variation W of the poly layer when compared to the target, $Vd(W+\Delta)$ is the target drain voltage when the cell gate dimensions are increased of $\Delta$, $Vd(W-\Delta)$ is the target drain voltage when the cell gate dimensions are reduced of $\Delta$, and Vpp is the supply voltage of voltage divider.

The above equations require the value L1, L2 to be much higher than W1, W2 and $\Delta$. In this way, we have a system of two equations and four variables; so, we must fix two variables to solve the system. Usually, L2 and W1 are fixed, in accordance with several rules. For example, L2 is chosen equal to the word line length, whereas W1 is the minimum value which is possible to define by the lithographic process. (However, while this choice is convenient for layout, and hence advantageous, it is not strictly necessary to the practice of the invention.)

The variable resistances R1, ..., RNM are provided by means of the silicided polysilicon conductor layer S2 of the control gate G of the dummy word line cells as shown in FIG. 6.

Similarly it is possible to use the polysilicon conductor layer S1 making up the cell floating gates CG as shown in FIG. 7.

In this case the structure of the first polycrystalline silicon layer S1 underlying the dummy word lines used must be unbroken.

This solution, as it can make use of a construction process capable of providing a contact with the first polycrystalline silicon layer S1, is the one that ensures the least current absorption. Indeed, this first polycrystalline silicon layer S1 has typically an intrinsic resistance much higher than that of the silicided second polysilicon layer S2.

Figure 14:
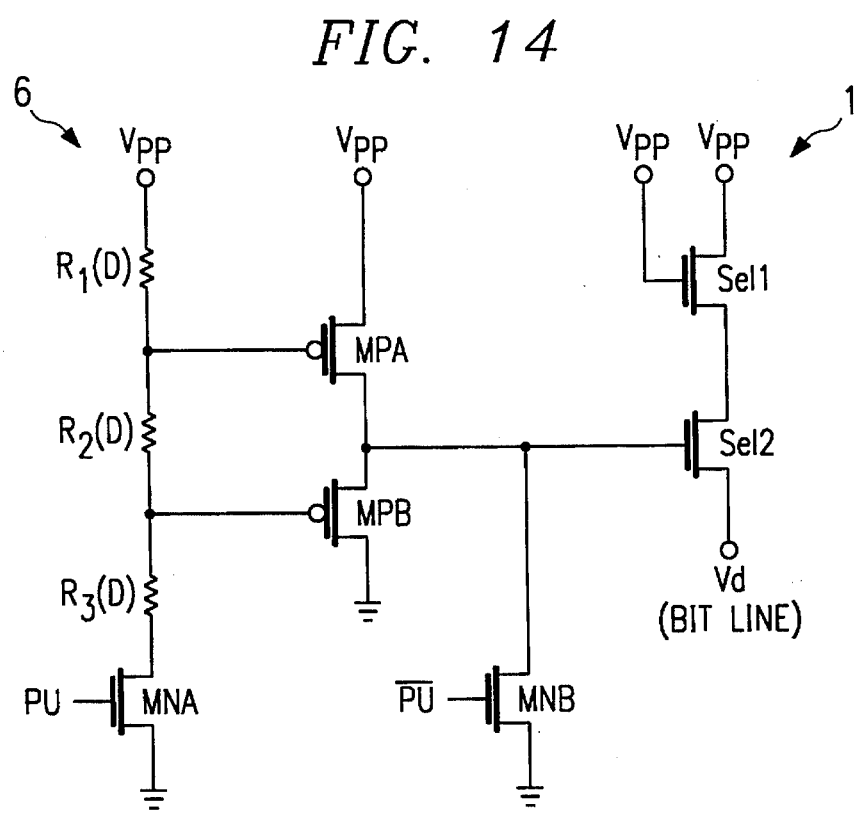
FIG. 14 shows a further alternative embodiment, in which a power-down transistor is included in series with the voltage-dividing ladder.

In this configuration it is also easier to connect in series with the divider 6 an MOS transistor having negligible resistance compared with that of the divider and which is used to break the path between the programming voltage ($V_{PP}$) and the ground reference voltage (GND) in those cases where the overall absorption of the memory chip must be minimal, e.g. in stand-by or deep power down situations. (An example of this is shown in FIG. 14, where the NMOS transistor MNA is turned off, when the active-high power-up signal PU goes low, to cut off current flow through the voltage-dividing ladder. The gates of MPA and MPB are then pulled up to turn them off, and another NMOS transistor MNB, gated by the complementary signal PU\, pulls down the gate of sel2.)

In the embodiment of FIG. 7, the control gate can be tied to Vpp or ground voltage, or even to a voltage Vcc which is intermediate between Vpp and the ground (so that the electric fields in the interpoly oxide layer are minimized, along the voltage divider). The particular choice is not very critical.

A third embodiment variation consists of using the two solutions proposed above short-circuiting the first polycrystalline silicon layer S1 and the second polycrystalline silicon layer S2 of the dummy word lines and providing the resistances R1, . . . , RNM by means of both layers as shown in FIG. 8.

These solutions can be provided by using the dummy word lines in the matrix of memory cells of the device.

This approach is advantageous in terms of space because it utilizes a limited number of dummy word lines.

As an alternative, the dummy word lines can also be provided outside the cell matrix in an area purposely dedicated to reception thereof.

Whatever the method of embodiment with which the variable resistive divider 6 is achieved, there are no limitations on its use in the voltage regulator 1, which uses a fixed voltage division (typically $V_{PP}$) to generate one or more reference voltages.

The structure of the regulator 1 of a programming voltage Vd of at least one cell in a non-volatile memory device proposed in FIG. 3 can be modified within the scope of the present invention.

This regulator 1 must however include a gain stage supplied with a fixed programming voltage $V_{PP}$ and having an input terminal connected to the variable divider 6 of the programming voltage and an output terminal connected to the programming line Vd of at least one memory cell.

FIGS. 9 to 11 show by way of example and not exhaustively other embodiments of a voltage regulator in accordance with the present invention. These embodiments show that the parameter-dependent chain may have only a single tap point (as in FIG. 9) or multiple tap points (FIGS. 10 and 11); may be directly connected to drive the gate of a pull-up transistor sel2 (FIG. 9), or may be only indirectly connected through an intermediate stage (FIGS. 10 and 11); and that fixed-voltage-drop elements may also be used (e.g. as in FIG. 11).

The use of dummy gates as variable resistances in accordance with the present invention ensures the most complete correspondence of cell gate dimension variations with the resistances of the divider 6 to overcome the problems of the known art solution.

Indeed, the resistances RNM(D) are achieved by means of the parallel of resistances rNM(D) provided with the same material in such a manner that a variation in the intrinsic resistance of the polysilicon does not alter the potential at the intermediate nodes.

Furthermore, the sizing of the regulator in accordance with the present invention is very easy because the regulator comprises a purely resistive divider 6 and does not require the precautions necessary in sizing any added circuit structure.

Concretely, having on the drain terminal of the cell 2 a drain voltage varying with the actual length of the cell means being able to operate with cells having an actual length which can vary in a broader range, thus improving the performance, feasibility and reliability of the memory circuit.

In conclusion the main advantage of the voltage regulator in accordance with the present invention is to supply at output a voltage whose value is constantly and appropriately adapted to the dimensions of the cell.

This regulator is therefore particularly suited to supplying power to the bit line of an electrically programmable nonvolatile memory.

Figure 12:
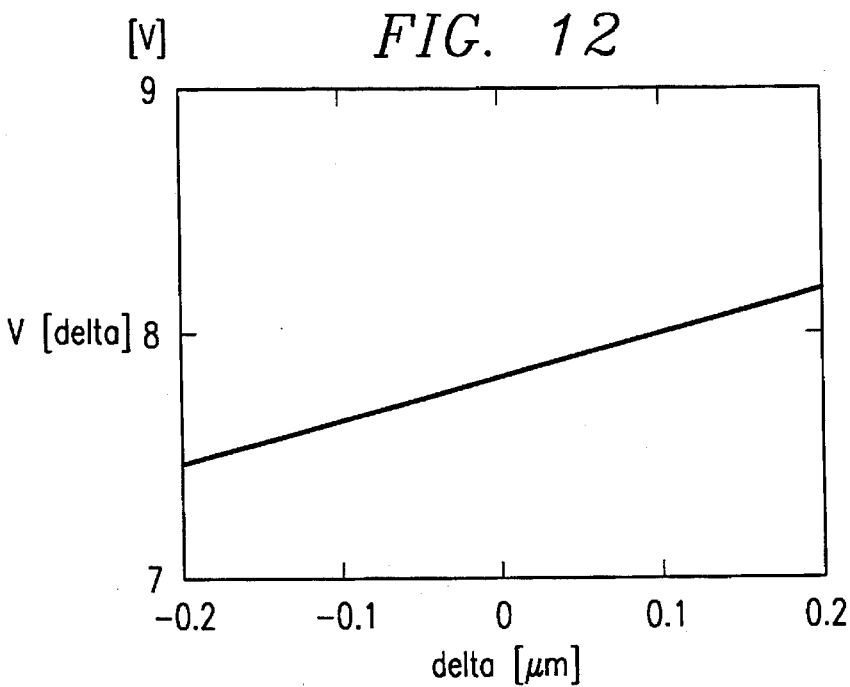
FIG. 12 shows a diagram of Vdd(Δ) when Δ changes.

FIG. 12 shows a diagram of the dependence of drain voltage Vd on Δ. In this sample embodiment, L1 is 34 cell pitches;

W1 is 0.8 μm;

L2 is 128 cell pitches;

W2 is 1.6 μm; and

Vpp=12 V.

Note that the drain voltage is now dependent on Δ as desired:

when Δ=−0.2 μm, Vd is approximately 7.4 V;

when Δ=−0.1 μm, Vd is approximately 7.6 V;

when Δ=0 μm, Vd is approximately 7.8 V;

when Δ=0.1 μm, Vd is approximately 8.0 V;

when Δ=0.2 μm, Vd is approximately 8.1 V.

Figure 13D:
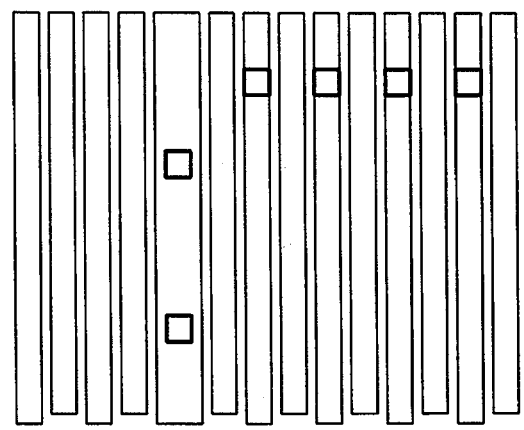
FIGS. 13A, 13B, 13C, and 13D are overlays showing different mask levels of a preferred implementation.
Figure 13C:
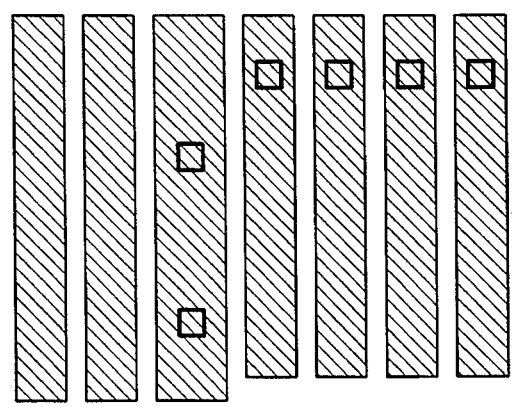
Figure 13B:
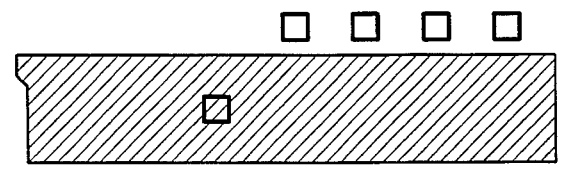
Figure 13A:
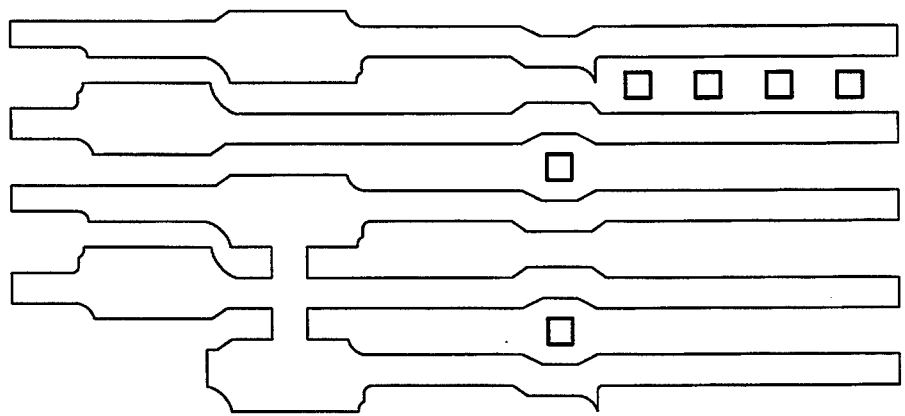

FIGS. 13A and 13B show a plan view of a sample layout of the last two dummy word lines of a matrix cell included in the device, and of an intermediate contact for the Vref voltage. FIG. 13B is simply an enlarged view of a portion of 13A.

According to a disclosed class of innovative embodiments, there is provided: A circuit for regulating the voltage applied to a bit line of a floating-gate memory, comprising: a voltage divider network connected between a programming voltage connection and chip ground; an array of floating-gate field effect transistor memory cells organized in bit lines; said voltage divider network comprising gate elements of said transistors of said array interconnected as resistive voltage divider elements; and a voltage regulator circuit, connected to drive at least a selected one of said bit lines of said array with a voltage which is determined by that of an intermediate point in said voltage divider.

According to another disclosed class of innovative embodiments, there is provided: A circuit for regulating the voltage applied to a bit line of a floating-gate memory, comprising: an array of floating-gate field effect transistor memory cells organized in bit lines; a voltage divider network, connected between a programming voltage connection and chip ground, comprising gate elements of said transistors of said array interconnected as resistive voltage divider elements; and a voltage regulator circuit, connected to drive at least a selected one of said bit lines of said array with a voltage which is equal to that of an intermediate point in said voltage divider.

According to another disclosed class of innovative embodiments, there is provided: A nonvolatile memory integrated circuit, comprising: an array of floating-gate field effect transistor memory cells, each including a control gate overlying a floating gate which is capacitively coupled to a respective transistor channel, wherein said array is organized in bit lines; a voltage divider comprising elements in the same thin film layer as said control gate, and configured to provide a dividing ratio which is affected by process variations in said thin film layer; and a voltage regulator circuit, connected to drive at least a selected one of the bit lines of said array with a voltage which is equal to that of an intermediate point in said voltage divider; whereby variations in the effective channel length of said memory cells produce corresponding variations in said regulated drain voltage, to provide an optimal regulated drain voltage.

According to another disclosed class of innovative embodiments, there is provided: A nonvolatile memory integrated circuit, comprising: an array of floating-gate field effect transistor memory cells, each including a control gate overlying a floating gate which is capacitively coupled to a respective transistor channel, wherein said array is organized in bit lines; a voltage divider comprising elements in the same thin film layer as said control gate, and also comprising elements in the same thin film layer as said floating gate, and configured to provide a dividing ratio which is affected by process variations in said thin film layer; and a voltage regulator circuit, connected to drive at least a selected one of the bit lines of said array with a voltage which is equal to that of an intermediate point in said voltage divider; whereby variations in the effective channel length of said memory cells produce corresponding variations in said regulated drain voltage, to provide an optimal regulated drain voltage.

According to another disclosed class of innovative embodiments, there is provided: A nonvolatile memory integrated circuit, comprising: an array of floating-gate field effect transistor memory cells, each including a control gate overlying a floating gate which is capacitively coupled to a respective transistor channel, wherein said array is organized in bit lines; a voltage divider comprising elements in the same thin film layer as said floating gate, and configured to provide a dividing ratio which is affected by process variations in said thin film layer; and a voltage regulator circuit, connected to drive at least a selected one of the bit lines of said array with a voltage which is equal to that of an intermediate point in said voltage divider; whereby variations in the effective channel length of said memory cells produce corresponding variations in said regulated drain voltage, to provide an optimal regulated drain voltage.

According to another disclosed class of innovative embodiments, there is provided: A method for regulating the write voltage applied to bit lines in a memory chip including nonvolatile field-effect transistors, comprising the steps of: generating a voltage at an intermediate node of a voltage divider, which includes at least one resistive element in the same thin film layer as at least one gate element of said nonvolatile field-effect transistors, said voltage divider being connected between a programming voltage connection and chip ground; and when a bit line is selected for a write operation, using a voltage regulator which references said intermediate node of said voltage divider to apply a constant regulated voltage to said selected bit line; whereby said regulated voltage has little or no dependence on said programming voltage, and is optimized for the variations in the device characteristics of memory cells of the array.

According to another disclosed class of innovative embodiments, there is provided: a voltage regulator for electrically programmable non-volatile semiconductor memory devices of the type comprising a gain stage supplied by a programming voltage and having an input terminal connected to a divider of said programming voltage and an output terminal connected to a programming line of at least one memory cell, comprising at least one circuit element capable of adapting the programming line voltage on the basis of the length of the memory cell.

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

For another example, another way of achieving the desired dependence on device fabrication characteristics would be to include some other load element, such as a diode or diode-connected transistor, which was NOT dependent on certain device fabrication characteristics.

Moreover, some further modifications, adaptable to the circuits of the present application, may be indicated in a copending application of the same inventors which describes a different drain regulator structure: this is copending application Ser. No. 08/368,211, entitled "Voltage Regulator for Non-Volatile Semiconductor Electrically Programmable Memory Devices" (Atty. Docket 93-AG-072/PCB-025). This application claims priority from EPC App'n 93830542.2, filed Dec. 31, 1993, and has an effective US filing date simultaneous with that of the present application. This application and its priority application are both hereby expressly incorporated by reference.

What is claimed is:

1. A circuit for regulating the voltage applied to a bit line of a floating-gate memory, comprising:

a voltage divider network connected between a programming voltage connection and chip ground;

an array of floating-gate field effect transistor memory cells organized in bit lines;

said voltage divider network comprising gate elements of said transistors of said array interconnected as resistive voltage divider elements; and a voltage regulator circuit, connected to drive at least a selected one of said bit lines of said array with a voltage which is determined by that of an intermediate point in said voltage divider.

2. The integrated circuit of claim 1, further comprising a plurality of bit line selection transistors, interconnected with logic elements so that said voltage regulator circuit is only connected to one of said bit lines at a time, and only during a write mode operation.

3. The integrated circuit of claim 1, wherein said floating-gate memory cells are EEPROM cells.

4. A circuit for regulating the voltage applied to a bit line of a floating-gate memory, comprising:

an array of floating-gate field effect transistor memory cells organized in bit lines;

a voltage divider network, connected between a programming voltage connection and chip ground, comprising gate elements of said transistors of said array interconnected as resistive voltage divider elements; and a voltage regulator circuit, connected to drive at least a selected one of said bit lines of said array with a voltage which is equal to that of an intermediate point in said voltage divider.

5. The integrated circuit of claim 4, further comprising a plurality of bit line selection transistors, interconnected with logic so that said voltage regulator is only connected to one of said bit lines at a time, and only during a write mode operation.

6. The integrated circuit of claim 4, wherein said floating-gate memory cells are EEPROM cells.

7. A nonvolatile memory integrated circuit, comprising:

an array of floating-gate field effect transistor memory cells, each including a control gate overlying a floating gate which is capacitively coupled to a respective transistor channel, wherein said array is organized in bit lines;

a voltage divider comprising elements in the same thin film layer as said control gate, and configured to provide a dividing ratio which is affected by process variations in said thin film layer; and a voltage regulator circuit, connected to drive at least a selected one of the bit lines of said array with a voltage which is equal to that of an intermediate point in said voltage divider;

wherein variations in the effective channel length of said memory cells produce corresponding variations in said regulated drain voltage, to provide an optimal regulated drain voltage.

8. The integrated circuit of claim 7, wherein said control gate and said floating gate are both polycrystalline and predominately comprise silicon.

9. The integrated circuit of claim 7, wherein said voltage divider consists of control gate elements of said transistors of said array interconnected as resistive voltage divider elements.

10. The integrated circuit of claim 7, wherein said voltage divider consists of control gate elements and floating gate elements of said transistors of said array interconnected as resistive voltage divider elements.

11. The integrated circuit of claim 7, further comprising a plurality of bit line selection transistors, interconnected with logic elements so that said voltage regulator circuit is only connected to one of said bit lines at a time, and only during a write mode operation.

12. The integrated circuit of claim 7, wherein said floating-gate memory cells are EEPROM cells.

13. A nonvolatile memory integrated circuit, comprising:
an array of floating-gate field effect transistor memory cells, each including a control gate overlying a floating gate which is capacitively coupled to a respective transistor channel, wherein said array is organized in bit lines;
a voltage divider comprising elements in the same thin film layer as said control gate, and also comprising elements in the same thin film layer as said floating gate, and configured to provide a dividing ratio which is affected by process variations in said thin film layer; and
a voltage regulator circuit, connected to drive at least a selected one of the bit lines of said array with a voltage which is equal to that of an intermediate point in said voltage divider;
wherein variations in the effective channel length of said memory cells produce corresponding variations in said regulated drain voltage, to provide an optimal regulated drain voltage.

14. The integrated circuit of claim 13, wherein said control gate and said floating gate are both polycrystalline and predominately comprise silicon.

15. The integrated circuit of claim 13, wherein said voltage divider network consists of control gate elements of said transistors of said array interconnected as resistive voltage divider elements.

16. The integrated circuit of claim 13, wherein said voltage divider network consists of control gate elements and floating gate elements of said transistors of said array interconnected as resistive voltage divider elements.

17. The integrated circuit of claim 13, further comprising a plurality of bit line selection transistors, interconnected with logic elements so that said voltage regulator circuit is only connected to one of said bit lines at a time, and only during a write mode operation.

18. The integrated circuit of claim 13, wherein said floating-gate memory cells are EEPROM cells.

19. A nonvolatile memory integrated circuit, comprising:
an array of floating-gate field effect transistor memory cells, each including a control gate overlying a floating gate which is capacitively coupled to a respective transistor channel, wherein said array is organized in bit lines;
a voltage divider comprising elements in the same thin film layer as said floating gate, and configured to provide a dividing ratio which is affected by process variations in said thin film layer; and
a voltage regulator circuit, connected to drive at least a selected one of the bit lines of said array with a voltage which is equal to that of an intermediate point in said voltage divider;
wherein variations in the effective channel length of said memory cells produce corresponding variations in said regulated drain voltage, to provide an optimal regulated drain voltage.

20. The integrated circuit of claim 19, wherein said control gate and said floating gate are both polycrystalline and predominately comprise silicon.

21. The integrated circuit of claim 19, wherein said voltage divider network consists of control gate elements of said transistors of said array interconnected as resistive voltage divider elements.

22. The integrated circuit of claim 19, wherein said voltage divider network consists of control gate elements and floating gate elements of said transistors of said array interconnected as resistive voltage divider elements.

23. The integrated circuit of claim 19, further comprising a plurality of bit line selection transistors, interconnected with logic so that said voltage regulator is only connected to one of said bit lines at a time, and only during a write mode operation.

24. The integrated circuit of claim 19, wherein said floating-gate memory cells are EEPROM cells.

25. A method for regulating the write voltage applied to bit lines in a memory chip including nonvolatile field-effect transistors, comprising the steps of:
(a.) generating a voltage at an intermediate node of a voltage divider, which includes at least one resistive element in the same thin film layer as at least one gate element of said nonvolatile field-effect transistors, said voltage divider being connected between a programming voltage connection and chip ground; and
(b.) when a bit line is selected for a write operation, using a voltage regulator which references said intermediate node of said voltage divider to apply a constant regulated voltage to said selected bit line;
wherein said regulated voltage has little or no dependence on said programming voltage, and is optimized for the variations in the device characteristics of memory cells of the array.

26. The method of claim 25, wherein said voltage regulator comprises an operational amplifier.

27. A voltage regulator for electrically programmable non-volatile semiconductor memory devices of the type comprising a gain stage supplied by a programming voltage and having an input terminal connected to a divider of said programming voltage and an output terminal connected to a programming line of at least one memory cell, comprising at least one circuit element capable of adapting the programming line voltage on the basis of the length of the memory cell.

28. The voltage regulator of claim 27, wherein said element is the divider of the programming voltage and comprises resistances having variable resistance.

29. The voltage regulator of claim 28, wherein said resistances have a resistivity value correlated with the length of the memory cell.

30. The voltage regulator of claim 28, wherein said resistances are provided in a second layer of polysilicon and silicide forming the command gates of the cells of a word line incorporated in the memory device.

31. The voltage regulator of claim 28, wherein said resistances are provided in a first layer of polycrystalline forming the floating gate of the cells of a word line incorporated in the memory device.

32. The voltage regulator of claim 30, wherein said first polysilicon layer and second polysilicon layer are mutually short-circuited.

33. The voltage regulator of claim 30, wherein said memory device comprises a cell matrix wherein said resistances are provided in dummy word lines incorporated in the memory device inside the cell matrix.

34. The voltage regulator of claim 30, wherein said memory device comprises a cell matrix wherein said resistances are provided in dummy word lines incorporated in the memory device outside the cell matrix.

35. The nonvolatile memory integrated circuit of claim 7, wherein said voltage divider is a resistive voltage divider.

36. The nonvolatile memory integrated circuit of claim 13, wherein said voltage divider is a resistive voltage divider.

37. The nonvolatile memory integrated circuit of claim 19, wherein said voltage divider is a resistive voltage divider.

38. The nonvolatile memory integrated circuit of claim 25, wherein said voltage divider is a resistive voltage divider.

39. The nonvolatile memory integrated circuit of claim 27, wherein said voltage divider is a resistive voltage divider.

* * * * *